(12) United States Patent
Ito

(10) Patent No.: US 10,190,518 B2
(45) Date of Patent: Jan. 29, 2019

(54) VEHICLE CONTROL APPARATUS FOR DIAGNOSING THE CURRENT STATE OF THE BATTERY AND FOR CONTROLLING THE START-STOP FUNCTION ACCORDINGLY

(71) Applicant: TOYOTA JIDOSHA KABUSHIKI KAISHA, Toyota-shi, Aichi-ken (JP)

(72) Inventor: Koji Ito, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/129,452

(22) PCT Filed: Mar. 11, 2015

(86) PCT No.: PCT/IB2015/000311
§ 371 (c)(1),
(2) Date: Sep. 27, 2016

(87) PCT Pub. No.: WO2015/145231
PCT Pub. Date: Oct. 1, 2015

(65) Prior Publication Data
US 2017/0114741 A1 Apr. 27, 2017

(30) Foreign Application Priority Data
Mar. 28, 2014 (JP) .................................. 2014-070431

(51) Int. Cl.
*F02D 41/04* (2006.01)
*G01R 31/36* (2006.01)
(Continued)

(52) U.S. Cl.
CPC ......... *F02D 41/042* (2013.01); *F02D 41/065* (2013.01); *F02D 41/08* (2013.01);
(Continued)

(58) Field of Classification Search
CPC ............. F02D 41/042; F02D 2200/503; F02N 11/0814; F02N 11/0818; F02N 11/0825; F02N 11/0862
(Continued)

(56) References Cited

U.S. PATENT DOCUMENTS

| 5,842,534 | A | * | 12/1998 | Frank | ........................ | B60K 6/48 |
| | | | | | | 180/65.25 |
| 6,316,842 | B1 | * | 11/2001 | Kuroda | .................... | B60K 6/48 |
| | | | | | | 180/65.25 |

(Continued)

FOREIGN PATENT DOCUMENTS

| CN | 102333946 A | 1/2012 |
| EP | 1079496 A2 | 2/2001 |

(Continued)

*Primary Examiner* — Mahmoud Gimie
*Assistant Examiner* — Josh Campbell
(74) *Attorney, Agent, or Firm* — Oliff PLC

(57) ABSTRACT

A vehicle control apparatus includes a current sensor that detects a current value of a battery; and a processing device that suppresses initiation of idling stop control in a vehicle non-stop state with a vehicle speed higher than 0, in the case where an abnormal state of the battery is detected based on an output signal of the current sensor in the vehicle non-stop state.

9 Claims, 11 Drawing Sheets

(51) Int. Cl.
  *G01R 31/02* (2006.01)
  *F02D 41/06* (2006.01)
  *F02D 41/08* (2006.01)
  *F02D 41/26* (2006.01)
  *F02N 11/08* (2006.01)
  *G01R 31/00* (2006.01)

(52) U.S. Cl.
  CPC .......... *F02D 41/26* (2013.01); *F02N 11/0825* (2013.01); *G01R 31/026* (2013.01); *G01R 31/3606* (2013.01); *G01R 31/3693* (2013.01); *F02D 2200/503* (2013.01); *F02N 11/0814* (2013.01); *F02N 11/0818* (2013.01); *F02N 11/0862* (2013.01); *F02N 2200/062* (2013.01); *F02N 2200/063* (2013.01); *F02N 2200/0801* (2013.01); *G01R 31/006* (2013.01); *Y02T 10/48* (2013.01)

(58) Field of Classification Search
  USPC ........................................ 123/179.4; 701/112
  See application file for complete search history.

(56) References Cited

U.S. PATENT DOCUMENTS

| | | | | |
|---|---|---|---|---|
| 6,460,500 | B1* | 10/2002 | Ooyama | F02N 7/00 123/179.3 |
| 6,605,946 | B1 | 8/2003 | Yokoyama | |
| 2003/0202298 | A1* | 10/2003 | Tamaki | B60L 3/0023 361/23 |
| 2007/0251741 | A1* | 11/2007 | Kidston | B60L 11/14 180/65.29 |
| 2009/0128157 | A1 | 5/2009 | Moriya | |
| 2009/0204314 | A1* | 8/2009 | Aoki | B60W 20/10 701/112 |
| 2012/0029746 | A1 | 2/2012 | Ito et al. | |
| 2012/0143469 | A1* | 6/2012 | Gwon | F02N 11/0837 701/102 |
| 2012/0303251 | A1* | 11/2012 | Shimizu | F02D 13/0238 701/113 |
| 2013/0106180 | A1* | 5/2013 | Akimasa | F02N 11/0814 307/9.1 |
| 2013/0278221 | A1* | 10/2013 | Maeda | B60L 3/0046 320/134 |

FOREIGN PATENT DOCUMENTS

| | | |
|---|---|---|
| JP | 09074617 A * | 3/1997 |
| JP | H11-257115 A | 9/1999 |
| JP | 2001-069681 A | 3/2001 |
| JP | 2006-022710 A | 1/2006 |
| JP | 2007-225562 A | 9/2007 |
| JP | 2009-138647 A | 6/2009 |
| JP | 2012-052505 A | 3/2012 |

* cited by examiner

VEHICLE CONTROL APPARATUS FOR DIAGNOSING THE CURRENT STATE OF THE BATTERY AND FOR CONTROLLING THE START-STOP FUNCTION ACCORDINGLY

BACKGROUND OF THE INVENTION

1. Field of the Invention

The present invention relates to a vehicle control apparatus.

2. Description of Related Art

There has been known an automatic stop-start control apparatus for an internal combustion engine, in which when an abnormality occurs in the power supply circuit, sometimes electric power cannot be supplied to an E/G starter motor from a battery, and thus the automatic stop-start control for the engine is not performed (for example, refer to Japanese Patent Application Publication No. 2001-069681 (JP 2001-069681 A)).

SUMMARY OF THE INVENTION

It is useful to initiate idling stop control in a non-stop state of the vehicle by taking account of the state of the battery.

The present invention provides a vehicle control apparatus that is capable of initiating the idling stop control in the non-stop state of the vehicle by taking account of the state of the battery.

The vehicle control apparatus according to the solution of the present invention includes a current sensor that detects a current value of a battery; and a processing device that suppresses initiation of idling stop control in a vehicle non-stop state with a vehicle speed higher than 0, in the case where an abnormal state of the battery is detected based on an output signal of the current sensor in the vehicle non-stop state.

According to the present invention, it is possible to provide a vehicle control apparatus that is capable of initiating the idling stop control in the non-stop state of the vehicle by taking account of the state of the battery.

BRIEF DESCRIPTION OF THE DRAWINGS

Features, advantages and technical and industrial significance of exemplary embodiments of the invention will be described below with reference to the accompanying drawings, in which like numerals denote like elements, and wherein.

DETAILED DESCRIPTION OF EMBODIMENTS

Hereinafter, various embodiments will be described in detail with reference to the accompanying drawings.

Figure 1:
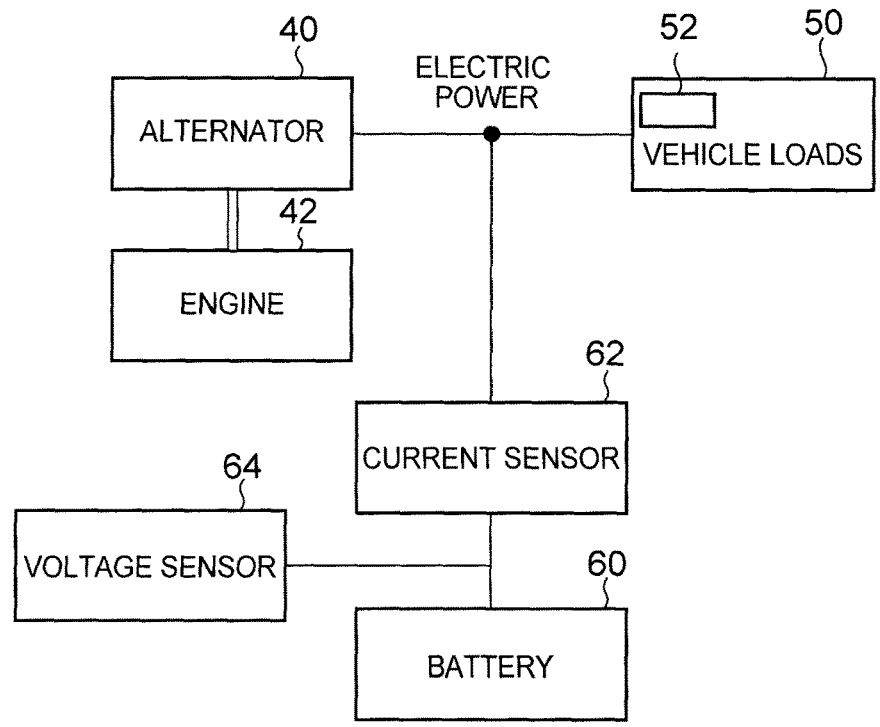
FIG. 1 is a structural diagram of a power supply system of a vehicle according to an embodiment.

FIG. 1 is a structural diagram of a power supply system of a vehicle according to an embodiment. As shown in FIG. 1, the present embodiment is suitable to be mounted in vehicles equipped only with an engine (that is, vehicles other than a hybrid vehicle or an electrical vehicle). In the structure shown in FIG. 1, an alternator 40 is mechanically connected with an engine 42. The alternator 40 is an electric generator for generating electric power by using the power from the engine 42. The electric power generated by the alternator 40 is used to charge a battery 60 and/or to drive vehicle loads 50. In addition, the battery 60 is provided with a current sensor 62. The current sensor 62 detects the battery current (the charge current and/or discharge current of the battery 60). The battery 60 is typically a lead battery, and may also be other kinds of batteries (or capacitors). A voltage sensor 64 is provided in the battery 60. The vehicle loads 50 may be any kinds of loads, for example, a starter 52, an air conditioning device, wipers, and so on. In such a structure, the state of charge (SOC) of the battery 60 can be controlled by controlling the power generation voltage of the alternator 40.

However, the present embodiment may also be applied to a dual-power supply structure. For example, the present embodiment can also be applied to a structure obtained by arranging a second battery in parallel with the battery 60 in the structure shown in FIG. 1. In this case, the starter 52 can be powered not only from the battery 60, but also from the second battery.

In addition, hereinafter, description will be further given by way of example on the premise of the structure shown in FIG. 1.

Figure 2A:
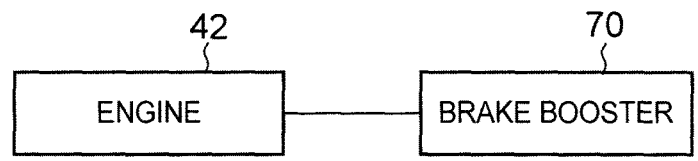
FIGS. 2A and 2B are diagrams showing exemplary structures associated with a brake booster.
Figure 2B:
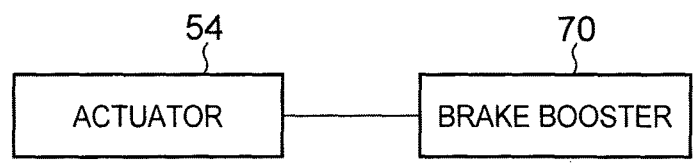

FIGS. 2A and 2B are diagrams showing exemplary structures associated with a brake booster. FIG. 2A shows a structure for generating a negative pressure by using the intake negative pressure of the engine 42, and FIG. 2B shows a structure for generating a negative pressure by using the driving of an actuator 54, wherein the brake booster 70 is a device for assisting the user's brake operation by means of the negative pressure. The brake booster 70 can be of any kind of specific structure, and the negative pressure can also be generated by any kind of method. For example, the negative pressure in the brake booster 70 can either be generated by using the intake negative pressure of the engine 42 as shown in FIG. 2A, or be generated by driving the actuator 54, such as a vacuum pump, as shown in FIG. 2B.

In addition, the brake booster 70 is not limited to the vacuum type, and may be compressed air type by using compressed air from a compressor (am example of the actuator 54), or hydraulic pressure type by using a hydraulic pressure pump (an example of the actuator 54). In the example shown in FIG. 2B, the negative pressure in the brake booster 70 can also be generated while the engine 42 is stopped. The actuator 54 is included in the vehicle loads 50 shown in FIG. 1, and is operated by the electric power from the battery 60.

In addition, hereinafter, description will be further given by way of example on the premise of the structure shown in FIG. 2A.

Figure 3:
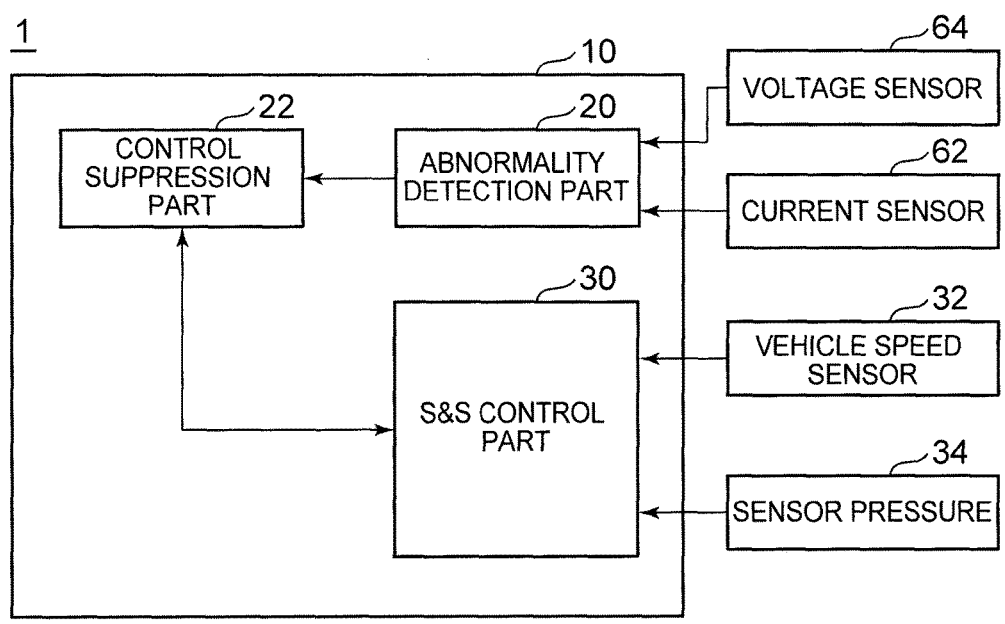
FIG. 3 is a systematic structural diagram of a control system according to an embodiment.

FIG. 3 is a systematic structural diagram showing a control system according to an embodiment.

The control system 1 includes a processing device 10. The processing device 10 can be constructed by an operation processing device including a CPU. Various functions (including the functions described later) of the processing device 10 can be implemented by any hardware, software, firmware, or the combination thereof. For example, any part or all of the functions of the processing device 10 can be implemented by an ASIC (application-specific integrated circuit), a FPGA (Field Programmable Gate Array), or a DSP (Digital Signal Processor), that is directed to a specific application. In addition, the processing device 10 may also be implemented by a plurality of processing devices (including the processing device in the sensor).

The processing device 10 includes an abnormality detection part 20, a control suppression part 22, and an S&S control part 30. In addition, S&S is an abbreviation of Stop & Start.

The S&S control part 30 is connected with a vehicle speed sensor 32 and a pressure sensor 34 for detecting the negative pressure in the brake booster 70 (hereinafter referred to as "booster negative pressure"). In addition, various information required for determination of predetermined idling stop initiation conditions described later (e.g., information related to internal air temperature, operation amount of a brake pedal, etc.) or the like, can be input to the S&S control part 30. The S&S control part 30 is connected with the control suppression part 22. The control suppression part 22 is connected with the abnormality detection part 20, and the abnormality detection part 20 is connected with the current sensor 62.

In addition, the abnormality detection part 20, the control suppression part 22 and the S&S control part 30 can be implemented as ECUs (electronic control unit), respectively. Alternatively, the abnormality detection part 20 and the control suppression part 22 may be implemented by a single ECU, while the S&S control part 30 may be implemented by another ECU. For example, the S&S control part 30 may be implemented by an idling stop control ECU other than the engine ECU for controlling the engine. In addition, in this case, the various ECUs may be connected in any manner. For example, the connection may be achieved via a bus such as CAN (controller area network), may be indirect connection via other ECU(s) etc., may be direct connection, or may be achieved by wireless communication.

The abnormality detection part 20 detects the abnormal state of the battery 60. The abnormal state of the detected object is, for example, an abnormal state in which the engine 42 cannot be started by the starter 52. Hereinafter, as an example, the open circuit fault state of the battery 60 is provided as the abnormal state of the detected object. The open circuit fault of the battery 60 occurs due to an open circuit fault occurred inside the battery 60, or disengagement of terminals (wiring terminals) of the battery 60. The open circuit fault inside the battery 60 may occur due to internal mechanical damage (the pole is broken off, welding parts between the battery cells are broken, or the like), invasion of corrosive substances, evaporation of electrolyte solution, degradation over time, etc. In addition, when an open circuit fault occurs in the battery 60, current does not flow into the battery 60 any longer, and thus the battery current detected by the current sensor 62 becomes almost 0.

There are various kinds of methods for detecting the open circuit fault of the battery 60, and any method may be used. For example, the open circuit fault of the battery 60 can be detected by using the method described in Japanese Patent Application Publication No. 2007-225562 (JP 2007-225562 A). Preferred embodiments of the method for detecting the open circuit fault of the battery 60 will be described later.

The control suppression part 22 suppresses the control of the S&S control part 30 based on the detection result of the abnormality detection part 20, and so on. This will be described later.

The S&S control part 30 determines whether predetermined idling stop initiation conditions are satisfied or not based on the vehicle speed information from the vehicle speed sensor 32, and so on, and if it is determined that the predetermined idling stop initiation conditions are satisfied, the engine is stopped to initiate the idling stop control. Hereinafter, for the sake of convenience, the idling stop control performed in the vehicle stop state will be referred to as "stop S&S". In addition, the initiation conditions for the stop S&S will be referred to as "stop S&S initiation conditions". The stop S&S initiation conditions include the vehicle speed being 0. Other conditions included by the stop S&S initiation conditions may be any conditions, for example, may include the open circuit fault of the battery 60 being not detected based on the voltage sensor 64, the brake pedal being depressed, the negative pressure of the booster being at or above a predetermined value, and conditions related to the air conditioner state, the SOC of the battery 60, the road slope, etc.

The S&S control part 30 also initiates the idling stop control in the vehicle deceleration state. Hereinafter, the idling stop control performed in the vehicle deceleration state will be referred to as "deceleration S&S". In addition, the initiation conditions for the deceleration S&S will be referred to as "deceleration S&S initiation conditions". The deceleration S&S initiation conditions include the vehicle speed being at or below a predetermined vehicle speed Vth (hereinafter referred to as "E/G stop vehicle speed Vth"). The E/G stop vehicle speed Vth can be a value within a low vehicle speed range, such as around 13 km/h, and can also be set variable as described later. Other conditions included by the deceleration S&S initiation conditions may be any conditions, for example, may include the open circuit fault of the battery 60 being not detected based on the voltage sensor 64, the brake pedal being depressed, the negative pressure of the booster being at or above a predetermined value, and conditions related to the air conditioner state, the SOC of the battery 60, the road slope, etc.

Figure 4A:
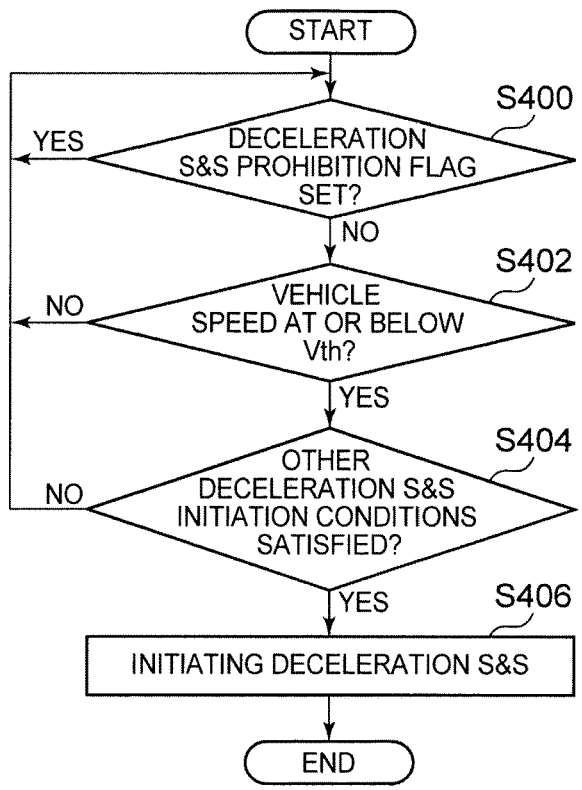
FIGS. 4A and 4B are flowcharts showing an example of S&S initiation processing performed by an S&S control part.
Figure 4B:
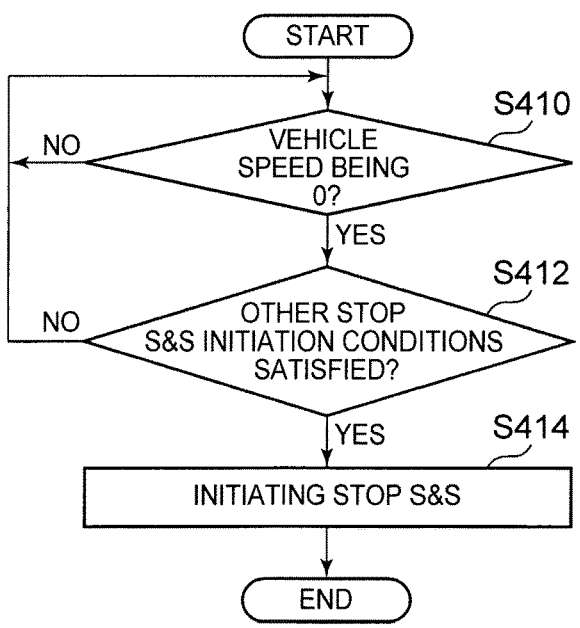

FIGS. 4A and 4B are flowcharts showing an example of the S&S initiation processing performed by the S&S control part 30, wherein FIG. 4A shows processing related to the deceleration S&S, and FIG. 4B shows processing related to the stop S&S. The processing routines shown in FIGS. 4A and 4B are repeatedly performed in parallel, respectively, at a predetermined processing cycle time e.g. during the operation of the engine 42.

Referring to FIG. 4A, in step 400, it is determined whether or not a deceleration S&S prohibition flag is set.

The deceleration S&S prohibition flag is sometimes set by the control suppression part 22. The deceleration S&S prohibition flag will be described in detail later. In the case where the deceleration S&S prohibition flag has been set, the processing returns to step 400, otherwise proceeds to step 402.

In step 402, based on the information from the vehicle speed sensor 32, it is determined whether or not the vehicle speed is at or below the E/G stop vehicle speed Vth. In the case where the vehicle speed is at or below the E/G stop vehicle speed Vth, the processing proceeds to step 404, otherwise returns to step 400.

In step 404, it is determined whether or not other deceleration S&S initiation conditions are satisfied. As mentioned above, other deceleration S&S initiation conditions may include the open circuit fault of the battery 60 being not detected based on the voltage sensor 64, the brake pedal being depressed, etc. In the case where other deceleration S&S initiation conditions are satisfied, the processing proceeds to step 406, otherwise returns to step 400.

In step 406, the deceleration S&S is initiated. That is, the engine 42 is stopped.

In addition, in FIG. 4A, the processing sequence of step 400, step 402, and step 404 may be arbitrarily set. For example, the determination in step 402 may also be performed preceding the determination in step 400.

Referring to FIG. 4B, in step 410, based on the information from the vehicle speed sensor 32, it is determined whether or not the vehicle speed is 0. In the case where the vehicle speed is 0, the processing proceeds to step 412, otherwise returns to step 410.

In step 412, it is determined whether or not other stop S&S initiation conditions are satisfied. As mentioned above, other stop S&S initiation conditions may include the open circuit fault of the battery 60 being not detected based on the voltage sensor 64, the brake pedal being depressed, etc. In the case where other stop S&S initiation conditions are satisfied, the processing proceeds to step 414, otherwise returns to step 410. In addition, the determination on other stop S&S initiation conditions may not be repeatedly performed. That is, in the case where the determination in step 412 is NO, the processing may be ended there (in this case, for the situation where the vehicle speed is 0 this time, the stop S&S is not initiated). Alternatively, the determination on other stop S&S initiation conditions may be repeatedly performed for predetermined times or predetermined period of time.

In step 414, the stop S&S is initiated. That is, the engine 42 is stopped.

In addition, in FIG. 4B, the processing sequence of step 410 and step 412 may be arbitrarily set. For example, the determination in step 412 may also be performed preceding the determination in step 410.

Figure 5:
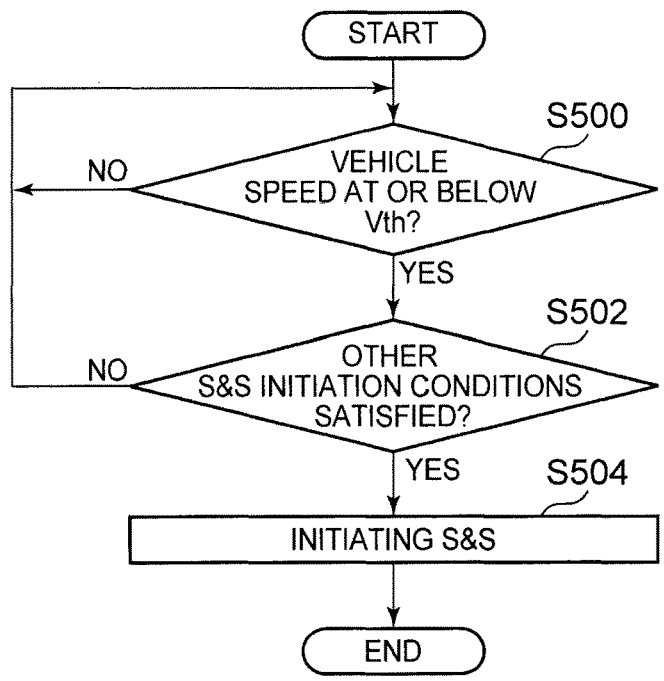
FIG. 5 is a flowchart showing another example of S&S initiation processing performed by the S&S control part.

FIG. 5 is a flowchart showing another example of the S&S initiation processing performed by the S&S control part 30. The processing shown in FIG. 5 is suitable to be performed in a structure in which the deceleration S&S prohibition flag is not used and the deceleration S&S and stop S&S are collectively performed (e.g. refer to FIG. 10, FIG. 12 and FIG. 13 described later). Here, as a premise, in the deceleration S&S initiation conditions and the stop S&S initiation conditions, conditions other than the vehicle speed are set to be identical, and are simply referred to as "S&S initiation conditions". In addition, in the deceleration S&S initiation conditions and the stop S&S initiation conditions, conditions other than the vehicle speed may also be different, and in this case, the determination processing is differently performed in accordance with the vehicle speed. The processing routine shown in FIG. 5 may be repeatedly performed at a predetermined processing cycle time e.g. during the operation of the engine 42.

In step 500, based on the information from the vehicle speed sensor 32, it is determined whether or not the vehicle speed is at or below the E/G stop vehicle speed Vth. If the vehicle speed is at or below the E/G stop vehicle speed Vth, the processing proceeds to step 502, otherwise returns to step 500.

In step 502, it is determined whether or not other S&S initiation conditions are satisfied. As mentioned above, other S&S initiation conditions may include the open circuit fault of the battery 60 being not detected based on the voltage sensor 64, the brake pedal being depressed, etc. If the other S&S initiation conditions are satisfied, the processing proceeds to step 504, otherwise returns to step 500.

In step 504, the deceleration S&S or the stop S&S is initiated. That is, the engine 42 is stopped. In addition, at this time, if the vehicle speed is 0, the stop S&S is initiated, and if the vehicle speed is larger than 0, the deceleration S&S is initiated.

Figure 6:
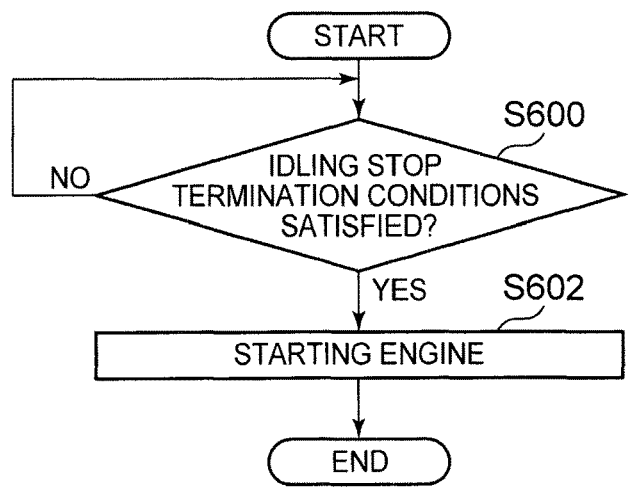
FIG. 6 is a flowchart showing an example of S&S termination processing performed by the S&S control part.

FIG. 6 is a flowchart showing an example of S&S termination processing performed by the S&S control part 30. The processing shown in FIG. 6 is repeatedly performed at a predetermined processing cycle time, for example, during the idling stop control following initiation of the deceleration S&S or the stop S&S.

In step 600, it is determined whether or not predetermined idling stop termination conditions are satisfied. The predetermined idling stop termination conditions are arbitrary, and may typically include, for example, the depression of the brake pedal being released, the negative pressure of the booster becoming lower than a predetermined value, and conditions related to the air conditioner state (degradation of the comfortability of the air conditioner), the battery state (decrease of the amount of charge), etc. In the case where the predetermined idling stop termination conditions are satisfied, the processing proceeds to step 602, otherwise returns to step 600.

In step 602, the engine 42 is restarted to terminate the idling stop control.

Figure 7:
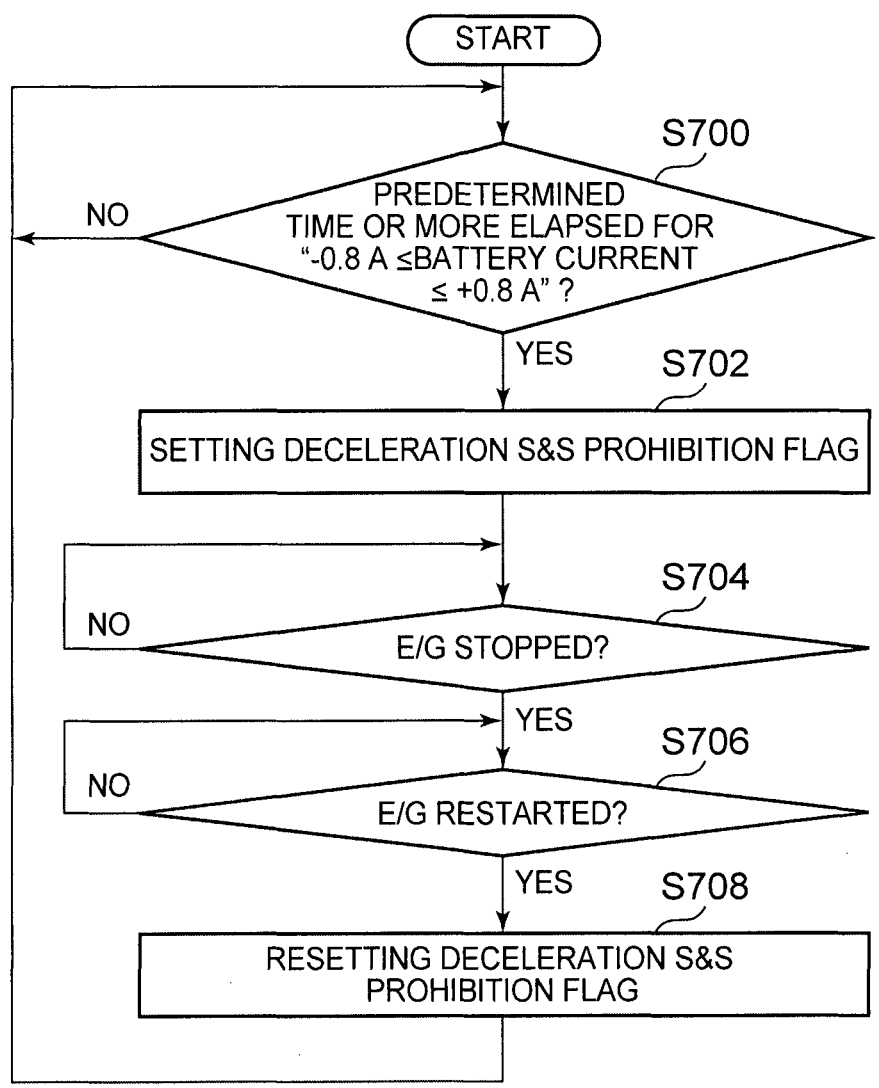
FIG. 7 is a flowchart showing an example of processing performed by an abnormality detection part and a control suppression part.

FIG. 7 is a flowchart showing an example of processing performed by the abnormality detection part 20 and the control suppression part 22. The processing routine shown in FIG. 7 is initiated, for example, upon turning-on of the ignition switch of the vehicle, and then is repeatedly performed at a predetermined processing cycle time, until the ignition switch is turned off. However, the processing in step 700 (and the processing in step 702 following it) is only performed during travel of the vehicle. The processing shown in FIG. 7 is suitable to be performed in the case where the processing shown in FIG. 4A and FIG. 4B is performed by the S&S control part 30.

In step 700, the abnormality detection part 20 determines whether or not an open circuit fault occurs in the battery 60. Specifically, based on the detected value of the current sensor 62, it is determined whether or not the state where the current of the battery is within a predetermined range $\Delta A1$ (in this example, $\geq -0.8$ [A] and $\leq 0.8$ [A]) has continued for a predetermined time $\Delta T1$. The predetermined range $\Delta A1$ corresponds to the range of the detected value of the current sensor 62 obtainable in the case where the open circuit fault occurs in the battery 60, and can be suitably determined by experiments, etc. Typically, the predetermined range $\Delta A1$ is a range centered at 0 [A], and is set in consideration of the offset of the current sensor 62. That is, there is possibly an initial offset (or an offset generated over time) in the current sensor 62, and even in the case where the current is actually 0 [A], sometimes a slight current value (for example, 0.8 [A]) will be displayed. The predetermined time ΔT1 is set by considering the fact that the current of the battery sometimes falls within the predetermined range ΔA1 even if no open circuit fault occurs in the battery 60. For example, in the case where noise is generated, in the case the vehicle loads 50 are not operated, the current of the battery may fall within the predetermined range ΔA1. The predetermined time ΔT1 may be, for example, 5 [s].

Here, it is preferred that the predetermined range ΔA1 is set to be relatively wide, and in addition, the predetermined time ΔT1 is set to be relatively short. The wider the predetermined range ΔA1 is, the higher the possibility of misdetection (being determined as open circuit fault though in normal) is, and the shorter the predetermined time ΔT1 is, the higher the possibility of the misdetection is. Therefore, when the predetermined range ΔA1 is set to be relatively wide and the predetermined time ΔT1 is set to be relatively short, the possibility of misdetection becomes higher. On the other hand, however, the wider the predetermined range ΔA1 is, the lower the possibility of the situation where the open circuit fault cannot be detected though it has actually occurred in the battery 60 (failure in detecting the open circuit fault) is (that is, the higher the detection sensitivity for the open circuit fault is), and the shorter the predetermined time ΔT1 is, the lower the possibility that the open circuit fault detection fails is, and it is possible to detect the open circuit fault earlier. In this regard, in the case of misdetection, as described later, the deceleration S&S is prohibited, and the opportunity to improve the fuel economy will be lost; while in the case of detection failure, a situation where after the engine is stopped following initiation of the deceleration S&S, the engine 42 cannot be started even if the negative pressure of the booster becomes insufficient may occur. Therefore, the predetermined range ΔA1 and/or the predetermined time ΔT1 are/is set preferably from the standpoint that avoiding the situation where the engine 42 cannot be started has priority over the deceleration S&S, so that the sensitivity for detecting the open circuit fault becomes high. In other words, the predetermined range ΔA1 and/or the predetermined time ΔT1 are/is set to have a high sensitivity from the standpoint that achievement of safety by ensuring the negative pressure of the booster has priority over improvement of fuel economy by the deceleration S&S.

In step 700, if it is determined that the state where the current of the battery is in the predetermined range ΔA1 has continued for the predetermined time ΔT1, it is determined that the battery 60 is in the open circuit fault state, and the processing proceeds to step 702. Otherwise, it is determined that no open circuit fault occurs in the battery 60, and the processing in step 700 will be performed again in the next processing cycle. In addition, in step 700, whether or not it has continued for the predetermined time ΔT1 may be determined by considering influence of noise. For example, it may be configured such that within a certain processing cycle time, in the case where the current of the battery is within the predetermined range ΔA1, a count value is incremented by 1, and in the case where the current of the battery is not within the predetermined range ΔA1, the count value is decremented by 1. In this case, the count value×the processing cycle time may be set as the time duration in which the current of the battery is within the predetermined range ΔA1, and it is determined whether or not the count value×the processing cycle time is equal to or above the predetermined time ΔT1.

In step 702, the control suppression part 22 sets the deceleration S&S prohibition flag. That is, the deceleration S&S prohibition flag is established. When the deceleration S&S prohibition flag is set, the deceleration S&S is prohibited. However, even in the case where the deceleration S&S prohibition flag is set, the stop S&S is still in a state where it can be initiated. That is, even in the case where the deceleration S&S prohibition flag is set, if the stop S&S initiation conditions are satisfied, the stop S&S will be initiated.

In step 704, the control suppression part 22 determines whether or not the engine 42 has been stopped by the stop S&S. Whether or not the engine 42 has been stopped by the stop S&S can be determined on the basis of the information obtained from the S&S control part 30. If it is determined that the engine 42 has been stopped by the stop S&S, the processing proceeds to step 706, otherwise it becomes a state to wait for stop of the engine by the stop S&S.

In step 706, the control suppression part 22 determines whether or not the engine 42 has been restarted following termination of the, stop S&S. Whether or not the engine 42 has been restarted can be determined on the basis of the information obtained from the S&S control part 30. If it is determined that the engine 42 has been restarted, the processing proceeds to step 708, otherwise it becomes a state to wait for restart of the engine.

In step 708, the control suppression part 22 resets the deceleration S&S prohibition flag set in the above step 702. That is, the deceleration S&S prohibition flag is cleared. Thus, if thereafter the deceleration S&S initiation conditions are satisfied, the deceleration S&S is initiated.

Here, when the determination in the above step 700 is YES, it means that an open circuit fault in the battery 60 is detected. When an open circuit fault occurs in the battery 60, the starter 52 cannot be operated, and thus the engine 42 cannot be restarted. Nevertheless, if the determination in the above step 706 is YES, it means that the detection of open circuit fault of the battery 60 in the above step 700 is incorrect (that is, misdetection). Therefore, in step 708, the deceleration S&S prohibition flag is reset.

According to the processing shown in FIG. 7, as described above, in the case where an open circuit fault in the battery 60 is detected, the deceleration S&S is prohibited. Thus, the situation where the deceleration S&S is initiated when the open circuit fault occurs in the battery 60 can be reduced. If the deceleration S&S is initiated when the open circuit fault occurs in the battery 60, even if the negative pressure of the booster is insufficient due to for example the driver's pump operation of the brake pedal during the deceleration S&S, the engine 42 cannot be restarted, and the negative pressure of the booster cannot be ensured. In addition, this situation is not limited to the brake booster 70 which uses the intake negative pressure of the engine 42 to generate the negative pressure of the booster, and may occur in the case of other kinds of brake booster 70. This is because, when there is an open circuit fault in the battery 60, the actuator 54 operated by the electric power of the battery 60 cannot be operated. According to the processing shown in FIG. 7, it is possible to reduce the situation where the negative pressure of the booster cannot be ensured, and to improve safety.

In addition, according to the processing shown in FIG. 7, as described above, even in the case where the open circuit fault of the battery 60 is detected, the stop S&S is permitted. Thus, it is possible to prevent the situation where the stop S&S is not performed any longer due to misdetection of the open circuit fault of the battery 60, and to ensure marketability with respect to the misdetection. That is, it is possible to reduce the situation where the opportunity for improving fuel economy is lost due to the misdetection of the open circuit fault of the battery 60. In addition, in the case where the open circuit fault of the battery 60 is not misdetected, if the stop S&S is initiated, there will be the situation where the engine 42 cannot be restarted even if the negative pressure of the booster is insufficient thereafter. This situation is undesirable; however, since it is in a state where the vehicle speed is 0, the brake force required for maintaining the stop state is low, and it is possible to ensure the required safety. In addition, in the processing shown in FIG. 7, as described above, the method for detecting the open circuit fault of the battery 60 (the predetermined range ΔA1 and/or predetermined time ΔT1) tends to give priority to the safety so that misdetection easily occurs, thus it can be contemplated that this situation rarely occurs. Thus, according to the processing shown in FIG. 7, it is possible to not only ensure the negative pressure of the booster, but also achieve the improvement of fuel economy.

In addition, according the processing shown in FIG. 7, as described above, the open circuit fault of the battery 60 is detected if the state where the current of the battery is within the predetermined range ΔA1 has continued for the predetermined time ΔT1. This method for detecting the open circuit fault of the battery 60 is especially suitable for detecting the open circuit fault of the battery 60 during travel of the vehicle. Although there are methods for detecting the open circuit fault of the battery 60 based on the voltage of the battery 60, such methods are not suitable for detecting the open circuit fault of the battery 60 during travel of the vehicle. This is because during travel of the vehicle, the alternator 40 is operated (that is, in the power generation state), thus sometimes, a significant voltage drop of the battery 60 cannot be detected even when an open circuit fault occurs in the battery 60. Thus, according to the processing shown in FIG. 7, it is possible to detect the open circuit fault of the battery 60 during travel of the vehicle. In addition, as described above, since it is configured to prohibit the deceleration S&S following detection of the open circuit fault of the battery 60, the open circuit fault of the battery 60 needs to be detected during travel of the vehicle. This is because the deceleration S&S is a control initiated in the vehicle travel state.

In addition, according to the processing shown in FIG. 7, as described above, even in the case where the deceleration S&S prohibition flag is set, when the engine has been restarted (that is, when the engine is successfully restarted), the deceleration S&S prohibition flag is reset. That is, the engine having been restarted means misdetection of the open circuit fault of the battery 60, so the deceleration S&S prohibition flag is reset. Therefore, as long as thereafter no open circuit fault of the battery 60 is detected again, it becomes a state where the deceleration S&S can be initiated. Thus, according to the processing shown in FIG. 7, it is possible to prevent the deceleration S&S prohibition state from being continuously maintained due to misdetection of the open circuit fault of the battery 60.

In addition, in the processing shown in FIG. 7, as described above, in the case where the engine has been restarted in step 706 (that is, in the case where the engine is successfully restarted), the deceleration S&S prohibition flag is reset. However, it may also be configured such that after the engine 42 has been stopped by the stop S&S, in the case where a battery current at or above a predetermined value (e.g., significantly larger than the battery current within the predetermined range ΔA1 used in the above step 700) is detected based on the detected signal of the current sensor 62 and/or in the case where a predetermined vehicle load 50 is normally operated, etc., the deceleration S&S prohibition flag is reset.

In addition, in the processing shown in FIG. 7, as described above, in the above step 700, a simple method for detecting the open circuit fault of the battery 60 only based on the current of the battery is provided. However, as described above, other deceleration S&S initiation conditions include the open circuit fault of the battery 60 being not detected based on the voltage sensor 64. Thus, it is actually such that, during travel of the vehicle, whether or not an open circuit fault occurs in the battery 60 is independently determined based on the voltage sensor 64 and the current sensor 62, respectively. However, other deceleration S&S initiation conditions may also not include the open circuit fault of the battery 60 being not detected based on the voltage sensor 64. This is because, as described above, during travel of the vehicle, the alternator 40 is operated, thus sometimes, a significant voltage drop of the battery 60 may not be detected even when the open circuit fault occurs in the battery 60. In addition, during stop of the vehicle, the open circuit fault of the battery 60 is determined based on the voltage sensor 64 rather than the current sensor 62.

In addition, in the processing shown in FIG. 7, as described above, in the case where the open circuit fault of the battery 60 is detected, the deceleration S&S is prohibited by setting the deceleration S&S prohibition flag; however, it is also possible that in the case where the open circuit fault of the battery 60 is detected, other conditions included by the deceleration S&S initiation conditions are varied to achieve essentially the same configuration. For example, in the case where the open circuit fault of the battery 60 is detected, the deceleration S&S may also be prohibited by increasing a threshold for the negative pressure of the booster to infinite, etc.

Figure 8:
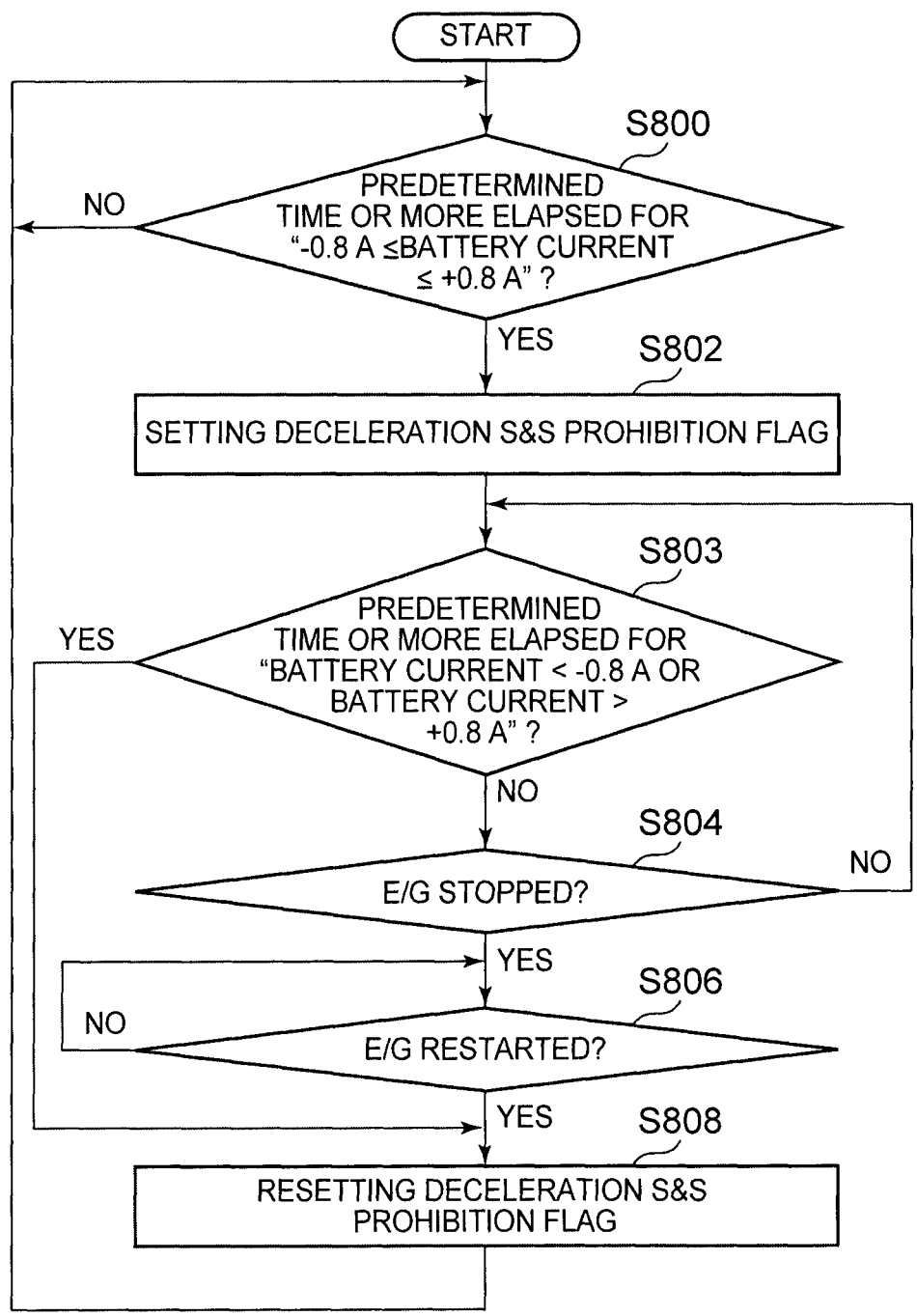
FIG. 8 is a flowchart showing another example of processing performed by the abnormality detection part and the control suppression part.

FIG. 8 is a flowchart showing another example of processing performed by the abnormality detection part 20 and the control suppression part 22. The processing routine shown in FIG. 8 is initiated, for example, upon turning-on of the ignition switch of the vehicle, and then is repeatedly performed at a predetermined processing cycle time, until the ignition switch is turned off. However, the processing in step 800 to step 803 is only performed during travel of the vehicle. The processing shown in FIG. 8 is suitable for the situation where the S&S control part 30 performs the processing shown in FIG. 4A and FIG. 4B.

The processing shown in FIG. 8 differs from that shown in FIG. 7 mainly in the addition of step 803. The processing in step 800, step 802, step 806 and step 808 may be the same as the processing in step 700, step 702, step 706 and step 708 shown in FIG. 7. Hereinafter, the processing unique to FIG. 8 will be described.

In step 803 performed following step 802, the abnormality detection part 20 determines again whether or not an open circuit fault occurs in the battery 60. Specifically, it is determined whether or not the state where the current of the battery is within a predetermined range ΔA2 (in this example, <−0.8 [A] or >0.8 [A]) has continued for a predetermined time ΔT2 based on the detected value of the current sensor 62. The predetermined range ΔA2 is set to exclude the range of the detected value of the current sensor 62 obtainable in the case where the open circuit fault occurs in the battery 60, and can be determined by experiments, etc. The predetermined range ΔA2 is a range excluding the predetermined range ΔA1 used in step 800. In this example, the predetermined range ΔA2 is lower than −0.8 [A] or larger than 0.8 [A], and is a range which is not provided with margin with respect to the predetermined range ΔA1 (in this example, ≥−0.8 [A] and ≤0.8 [A]). However, for example, the predetermined range ΔA2 may also be provided with margin with respect to the predetermined range ΔA1, such as being lower than −1.0 [A] or larger than 1.0 [A]. In addition, the margin may be set, like the determination condition in step 800, to be relatively large from the standpoint that avoiding the situation where the engine 42 cannot be started has priority over the deceleration S&S. The predetermined time ΔT2 may be set from the same standpoint as the predetermined time ΔT1 used in step 800, and may be for example 5 [s].

In addition, in step 803, whether or not it has continued for the predetermined time ΔT2 may be determined by considering influence of noise. For example, it can be configured such that within a certain processing cycle time, in the case where the current of the battery is within the predetermined range ΔA2, a count value is incremented by 1, and in the case where the current of the battery is not within the predetermined range ΔA2, the count value is decremented by 1. In this case, the count value×the processing cycle time may be set as the time duration in which the current of the battery is within the predetermined range ΔA2, and it is determined whether or not the count value×the processing cycle time is equal to or above the predetermined time ΔT2.

In step 803, if it is determined that the state where the current of the battery is within the predetermined range ΔA2 has continued for the predetermined time ΔT2, the processing proceeds to step 808, otherwise proceeds to step 804. Therefore, in the processing shown in FIG. 8, even if it is not determined to be YES in step 806, when it is determined that the state where the current of the battery is within the predetermined range ΔA2 has continued for the predetermined time ΔT2, the deceleration S&S prohibition flag is also reset.

In step 804, the control suppression part 22 determines whether or not the engine 42 has been stopped by the stop S&S. Whether or not the engine 42 has been stopped by the stop S&S can be determined on the basis of the information obtained from the S&S control part 30. If it is determined that the engine 42 has been stopped by the stop S&S, the processing proceeds to step 806, otherwise returns to step 803.

According to the processing shown in FIG. 8, the same effects can be achieved as the processing shown in FIG. 7. In addition, according to the processing shown in FIG. 8, even if there is temporarily a positive determination in step 800 such that the deceleration S&S prohibition flag is set, before the stop S&S is initiated thereafter, it is possible to reset the deceleration S&S prohibition flag according to the determination result in step 803. That is, even in the case where the open circuit fault of the battery 60 is temporarily detected in step 800 such that the deceleration S&S prohibition flag is set, thereafter whether or not the open circuit fault occurs in the battery 60 will be confirmed again. Thus, even in the case where the open circuit fault of the battery 60 is misdetected in step 800, it is possible to reset the deceleration S&S prohibition flag by the redetermination thereafter. As a result, it is possible to reduce the situation where the opportunity for improving fuel economy is lost due to misdetection of the open circuit fault of the battery 60.

In addition, in the processing shown in FIG. 8, in the case where the open circuit fault of the battery 60 is temporarily detected in step 800 such that the deceleration S&S prohibition flag is set, the determination in step 803 is repeatedly performed at a predetermined processing cycle time, until the engine 42 is stopped by the stop S&S. However, the determination in step 803 may be performed, before the engine 42 is stopped by the stop S&S, only once, or may be performed predetermined times no less than twice. In addition, the determination in step 803 may be performed, before the engine 42 is stopped by the stop S&S, every predetermined period of time (>> the predetermined processing cycle time) has elapsed, and may also be performed upon every predetermined travel distance.

Figure 9:
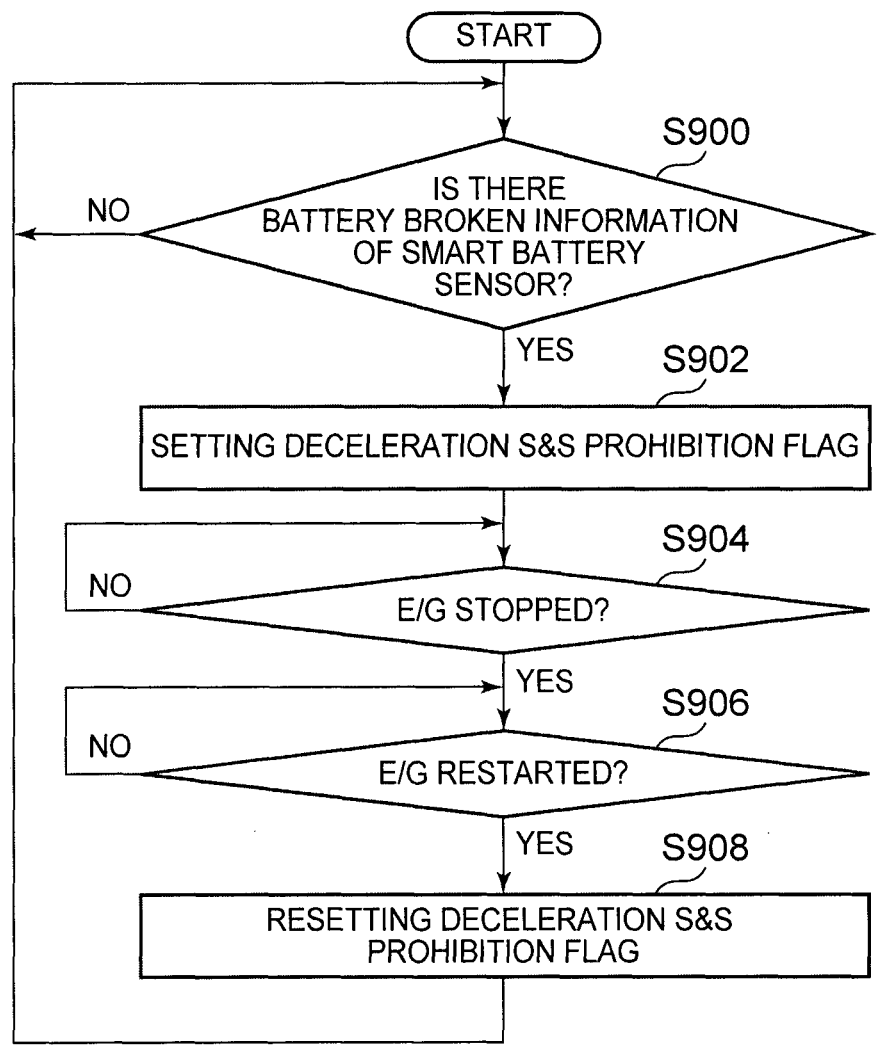
FIG. 9 is a flowchart showing another example of processing performed by the abnormality detection part and the control suppression part.

FIG. 9 is a flowchart showing another example of processing performed by the abnormality detection part 20 and the control suppression part 22. The processing routine shown in FIG. 9 is initiated, for example, upon turning-on of the ignition switch of the vehicle, and then is repeatedly performed at a predetermined processing cycle time, until the ignition switch is turned off. The processing shown in FIG. 9 is suitable for the situation where the S&S control part 30 performs the processing shown in FIG. 4A and FIG. 4B.

In the processing as shown in FIG. 9, as a premise, it is configured such that the voltage sensor 64 and the current sensor 62 are formed by a sensor obtained by integrated assembly of the sensors with a processing unit (e.g. microprocessor) (hereinafter, for the sake of simplicity, referred to as "smart battery sensor"). The smart battery sensor is also equipped with a temperature sensor therein. Hereinafter, as a premise, it is configured such that the processing unit inside the smart battery sensor has a function to detect the open circuit fault of the battery 60 such as the disengagement of battery terminals, and if it is detected that an open circuit fault occurs in the battery 60, a battery broken information is sent to the S&S control part 30.

The processing shown in FIG. 9 differs from that shown in FIG. 7 mainly in the processing in step 900. The processing in step 902 to step 908 shown in FIG. 9 may be the same as the processing in step 702 to step 708 shown in FIG. 7. Hereinafter, the processing unique to FIG. 9 will be described.

In step 900, the abnormality detection part 20 determines whether or not the battery broken information is received from the smart battery sensor. If the battery broken information is received from the smart battery sensor, it is determined that the battery 60 is in open circuit fault state, and the processing proceeds to step 902. Otherwise, it is determined that the battery 60 is not in the open circuit fault state, and the processing in step 900 will performed again in the next processing cycle.

According to the processing shown in FIG. 9, the same effects can be achieved as the processing shown in FIG. 7. In addition, the processing shown in FIG. 9 is especially suitable for the situation where the smart battery sensor has low precision for detecting the open circuit fault. This is because of the standpoint as follows: as described above, avoiding the situation where the engine 42 cannot be started has priority over the deceleration S&S.

In addition, in the processing shown in FIG. 9, the processing in step 900 and step 902 may be performed only during travel of the vehicle. This is because when the vehicle is stopped, considering drop of the voltage value, precision of the smart battery sensor for detecting the open circuit fault may become higher.

Figure 10:
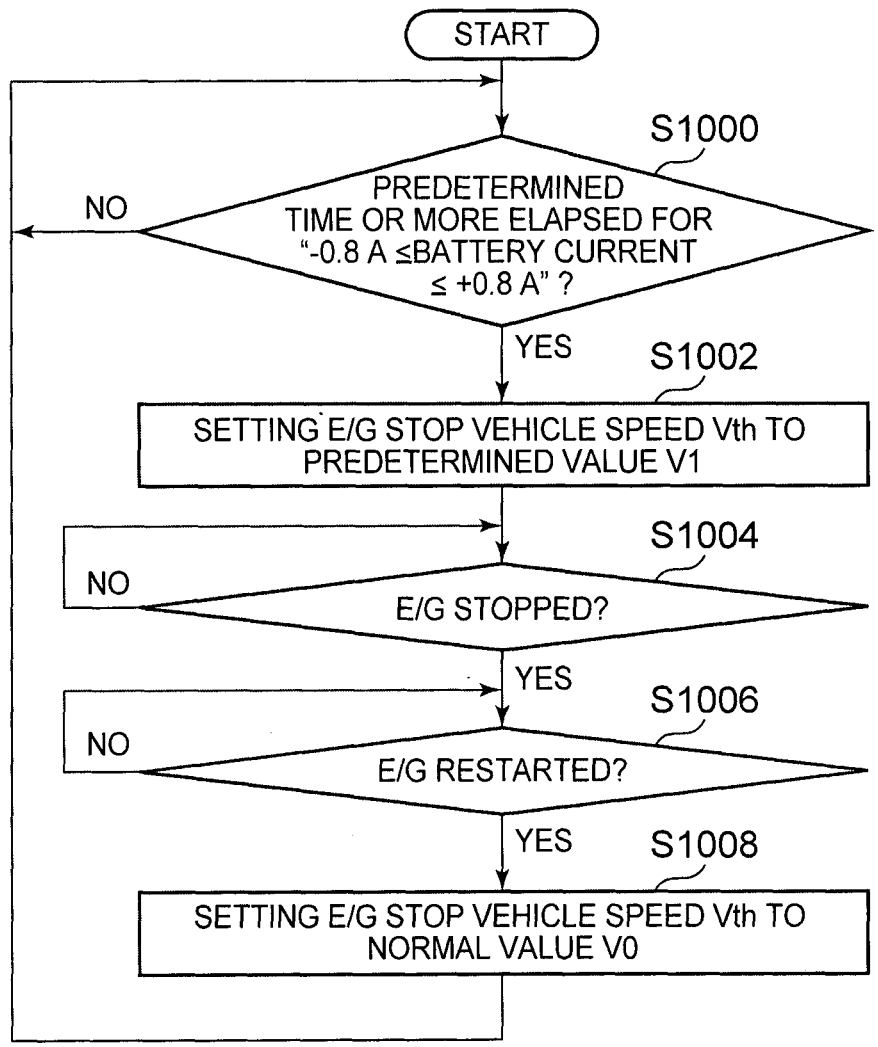
FIG. 10 is a flowchart showing another example of processing performed by the abnormality detection part and the control suppression part.

FIG. 10 is a flowchart showing another example of processing performed by the abnormality detection part 20 and the control suppression part 22. The processing routine shown in FIG. 10 is initiated, for example, upon turning-on of the ignition switch of the vehicle, and then is repeatedly performed at a predetermined processing cycle time, until the ignition switch is turned off. However, the processing in step 1000 (and the processing in step 1002 following it) is performed only during travel of the vehicle.

In the processing shown in FIG. 10, as a premise, it is configured such that the deceleration S&S is performed in a deceleration state with a speed at or below the E/G stop vehicle speed Vth. In other words, the deceleration S&S initiation conditions include the deceleration state with a speed at or below the E/G stop vehicle speed Vth. In addition, in the example shown in FIG. 10, since the deceleration S&S prohibition flag is not used, the deceleration S&S prohibition flag may be omitted. Therefore, the processing shown in FIG. 10 is suitable for the situation where the S&S control part 30 performs the processing shown in FIG. 5.

The processing shown in FIG. 10 differs from the processing shown in FIG. 7 mainly in the following aspect: in the case where the open circuit fault of the battery 60 is detected, instead of prohibiting the deceleration S&S, the vehicle speed at which the deceleration S&S can be initiated is reduced. The processing in step 1000 and step 1004 shown in FIG. 10 may be the same as the processing in step 700 and step 704 shown in FIG. 7. Hereinafter, the processing unique to FIG. 10 will be described.

In step 1002, the control suppression part 22 sets the E/G stop vehicle speed Vth to a predetermined value V1. The initial value of the E/G stop vehicle speed Vth may be a normal value V0. The normal value V0 may be any value including infinite, and for example may be a value within the low vehicle speed range around 13 km/h. The predetermined value V1 may be any value larger than 0 and smaller than the normal value V0. In addition, when the predetermined value V1 is 0, it means that the deceleration S&S is substantially prohibited (only the stop S&S is permitted), thus the processing shown in FIG. 10 is equivalent to that shown in FIG. 7.

In step 1004, the control suppression part 22 determines whether or not the engine 42 has been stopped by the deceleration S&S or the stop S&S. Whether or not the engine 42 has been stopped by the deceleration S&S or the stop S&S can be determined on the basis of the information obtained from the S&S control part 30. In the case where it is determined that the engine 42 has been stopped by the deceleration S&S or the stop S&S, the processing proceeds to step 1006, otherwise it becomes a state to wait for stop of the engine by the deceleration S&S or the stop S&S.

In step 1006, the control suppression part 22 determines whether or not the engine 42 has been restarted following termination of the deceleration S&S or the stop S&S. Whether or not the engine 42 has been restarted can be determined on the basis of the information obtained from the S&S control part 30. In the case where it is determined that the engine 42 has been restarted, the processing proceeds to step 1008, otherwise it becomes a state to wait for restart of the engine.

In step 1008, the control suppression part 22 sets the E/G stop vehicle speed Vth to the normal value V0. That is, the E/G stop vehicle speed Vth which has been set to the predetermined value V1 in the above step 1002 is recovered to the normal value V0.

According to the processing shown in FIG. 10, as described above, in the case where an open circuit fault of the battery 60 is detected, the E/G stop vehicle speed Vth in the deceleration S&S initiation conditions is reduced from the normal value V0 to the predetermined value V1. Thus, when the open circuit fault occurs in the battery 60, it is possible to reduce the situation where the deceleration S&S is initiated in a vehicle speed range higher than the predetermined value V1. If the deceleration S&S is initiated when the open circuit fault occurs in the battery 60, even if the negative pressure of the booster is insufficient due to for example the driver's pump operation of the brake pedal during the deceleration S&S, the engine 42 cannot be restarted, and it is difficult to ensure the negative pressure of the booster. This situation is undesirable especially in the relatively high vehicle speed range in which a relatively large brake force is required before stopping. According to the processing shown in FIG. 10, it is possible to reduce the situation where the negative pressure of the booster cannot be ensured in the relatively high vehicle speed range, and to improve safety.

In addition, according to the processing shown in FIG. 10, as described above, even in the case where the open circuit fault of the battery 60 is detected, the deceleration S&S is permitted in the vehicle speed range at or below the predetermined value V1 (the stop S&S is also permitted). Thus, it is possible to prevent the situation where the deceleration S&S and/or the stop S&S are not performed any longer due to misdetection of the open circuit fault of the battery 60, and to ensure marketability with respect to the misdetection. That is, it is possible to reduce the situation where the opportunity for improving fuel economy is lost due to misdetection of the open circuit fault of the battery 60. In addition, in the case where the open circuit fault of the battery 60 is not misdetected, if the deceleration S&S or the stop S&S is initiated, there will be the situation where the engine 42 cannot be restarted even if the negative pressure of the booster is insufficient thereafter. This situation is undesirable; however, since it is in a state where the vehicle speed is 0 or within a low vehicle speed range at or below the predetermined value V1, the brake force required for achieving stop state or maintaining the stop state is low, and it is possible to ensure the required safety. In addition, in the processing shown in FIG. 10, as described above, the method for detecting the open circuit fault of the battery 60 (the predetermined range $\Delta A1$ and/or predetermined time $\Delta T1$) tends to give priority to the safety so that misdetection easily occurs, thus it can be contemplated that this situation rarely occurs. Thus, according to the processing shown in FIG. 10, it is possible to not only ensure the negative pressure of the booster, but also achieve the improvement of fuel economy.

In addition, according to the processing shown in FIG. 10, as described above, the open circuit fault of the battery 60 is detected if the state where the current of the battery is within the predetermined range $\Delta A1$ has continued for the predetermined time $\Delta T1$. This method for detecting the open circuit fault of the battery 60 is especially suitable for detecting the open circuit fault of the battery 60 during travel of the vehicle. In addition, as described above, since it is configured such that the E/G stop vehicle speed Vth as the deceleration S&S initiation condition is reduced from the normal value V0 to the predetermined value V1 in the case where the open circuit fault of the battery 60 is detected, it is necessary to reliably detect the open circuit fault of the battery 60 during travel of the vehicle. This is because the deceleration S&S is a control initiated in the vehicle travel state.

In addition, according to the processing shown in FIG. 10, as described above, even in the case where the E/G stop vehicle speed Vth is reduced from the normal value V0 to the predetermined value V1, when the engine has been restarted (that is, when the engine is successfully restarted), the E/G stop vehicle speed Vth is recovered to the normal value V0. That is, the engine having been restarted means misdetection of the open circuit fault of the battery 60, so the E/G stop vehicle speed Vth is recovered to the normal value V0. Thus, as long as thereafter no open circuit fault of the battery 60 is detected again, it becomes a state where the deceleration S&S can be initiated in the vehicle speed range higher than the predetermined value V1. Thus, according to the processing shown in FIG. 10, it is possible to prevent the deceleration S&S prohibition state from being continuously maintained in the vehicle speed range higher than the predetermined value V1 due to misdetection of the open circuit fault of the battery 60.

In addition, in the processing shown in FIG. 10, as described above, in the case where the engine has been restarted in step 1006 (that is, in the case where the engine is successfully restarted), the E/G stop vehicle speed Vth is recovered to the normal value V0. However, it may also be configured such that after the engine 42 has been stopped by the deceleration S&S or the stop S&S, in the case where a battery current at or higher than a predetermined value (e.g., significantly larger than the battery current within the predetermined range ΔA1 used in the above step 1000) is detected based on the detected signal of the current sensor 62 and/or in the case where a predetermined vehicle load 50 is normally operated, etc., the E/G stop vehicle speed Vth is recovered to the normal value V0.

Figure 11:
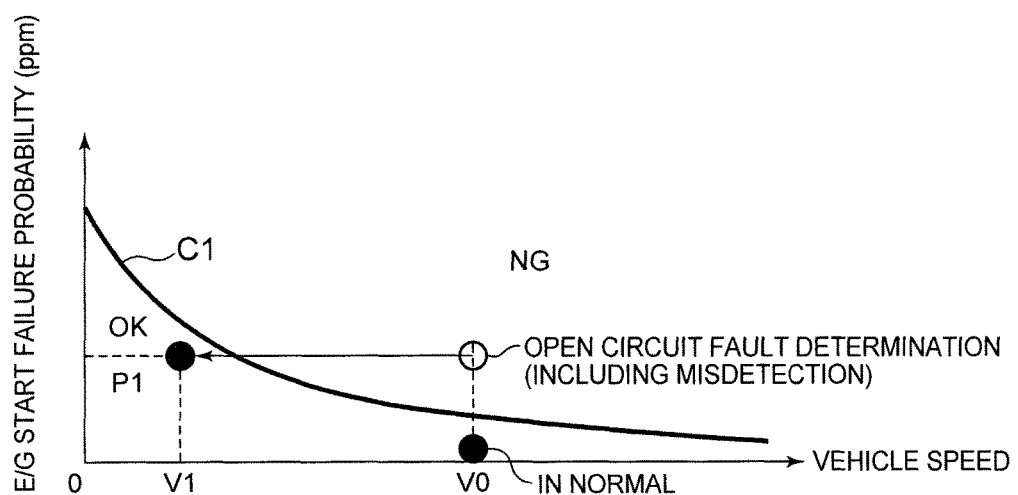
FIG. 11 is a diagram explaining an example of the method for setting a predetermined value.

FIG. 11 is a diagram explaining an example of the method for setting the predetermined value V1. In FIG. 11, the horizontal axis represents the vehicle speed, and the vertical axis represents the E/G restart failure probability [ppm]. In addition, ppm represents parts per million. The so-called E/G restart failure probability means the probability to become the situation where the engine 42 cannot be restarted after the engine has been stopped by the deceleration S&S or the stop S&S. In FIG. 11, of the regions divided by the curve C1, the upper region "NG" is a region in which the situation where the engine 42 cannot be restarted is not allowable, and the lower region "OK" is a region in which the situation where the engine 42 cannot be restarted is allowable. The curve C1 is set based on the design principle, and typically, it may represent the relation that the lower the vehicle speed is, the higher the allowable E/G restart failure probability is.

In FIG. 11, the E/G restart failure probability P1 corresponds to the E/G restart failure probability in the case of using the method for detecting the open circuit fault of the battery 60 in step 1000 of FIG. 10. In other words, the E/G restart failure probability P1 corresponds to the precision (reliability) for detecting the open circuit fault of the battery 60 in step 1000 of FIG. 10. At this time, if the E/G stop vehicle speed Vth is the normal value V0, as shown in FIG. 11, the E/G restart failure probability P1 falls within the region "NG". Therefore, as shown in FIG. 11, the predetermined value V1 is set so that the E/G restart failure probability P1 falls within the region "OK".

Figure 12:
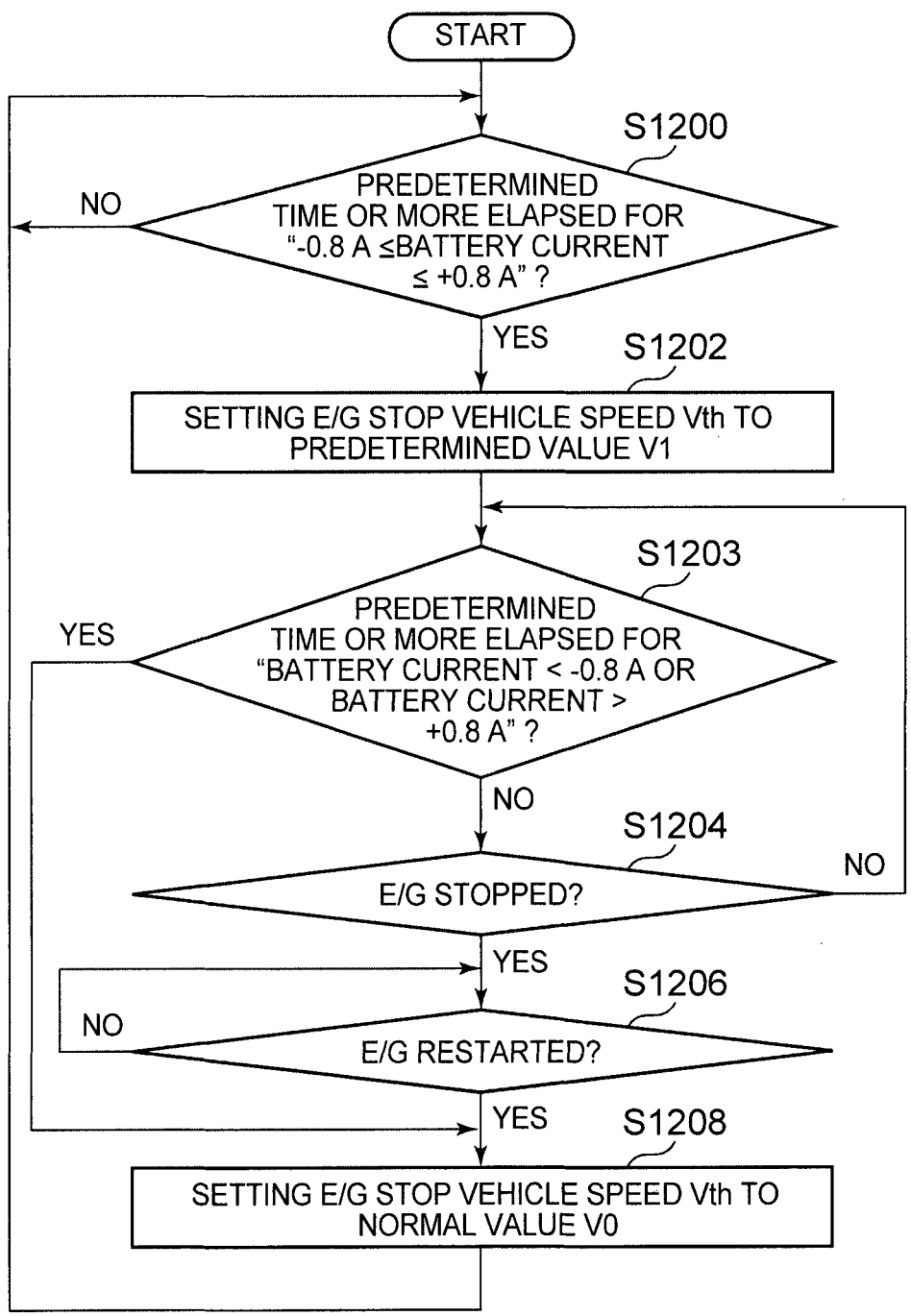
FIG. 12 is a flowchart showing another example of processing performed by the abnormality detection part and the control suppression part.

FIG. 12 is a flowchart showing another example of processing performed by the abnormality detection part 20 and the control suppression part 22. The processing routine shown in FIG. 12 is initiated, for example, upon turning-on of the ignition switch of the vehicle, and then is repeatedly performed at a predetermined processing cycle time, until the ignition switch is turned off. However, the processing in step 1200, step 1202 and step 1203 is only performed during travel of the vehicle.

The processing shown in FIG. 12 differs from that shown in FIG. 10 mainly in the addition of step 1203. The processing in step 1200, step 1202, step 1206 and step 1208 shown in FIG. 12 may be the same as the processing in step 1000, step 1002, step 1006 and step 1008 shown in FIG. 10. Hereinafter, the processing unique to FIG. 12 will be described.

As with the processing shown in FIG. 10, in the processing shown in FIG. 12, as a premise, it is configured such that the deceleration S&S is performed in a deceleration state with a speed at or below the E/G stop vehicle speed Vth. In other words, the deceleration S&S initiation conditions include the deceleration state with a speed at or below the E/G stop vehicle speed Vth. In addition, in the example shown in FIG. 12, since the deceleration S&S prohibition flag is not used, the deceleration S&S prohibition flag may be omitted. Therefore, the processing shown in FIG. 12 is suitable for the situation where the S&S control part 30 performs the processing shown in FIG. 5.

In step 1203, the abnormality detection part 20 determines again whether or not an open circuit fault occurs in the battery 60 in the same manner as that in step 803 shown in FIG. 8. In step 1203, if it is determined that the state where the current of the battery is within the predetermined range ΔA2 has continued for the predetermined time ΔT2, the processing proceeds to step 1208, otherwise proceeds to step 1204. Therefore, in the processing shown in FIG. 12, even if it is not determined to be YES in step 1206, when it is determined that the state where the current of the battery is within the predetermined range ΔA2 has continued for the predetermined time ΔT2, the E/G stop vehicle speed Vth is recovered to the normal value V0.

In step 1204, the control suppression part 22 determines whether or not the engine 42 has been stopped by the deceleration S&S or the stop S&S. Whether or not the engine 42 has been stopped by the deceleration S&S or the stop S&S can be determined based on the information obtained from the S&S control part 30. If it is determined that the engine 42 has been stopped by the deceleration S&S or the stop S&S, the processing proceeds to step 1206, otherwise returns to step 1203.

According to the processing shown in FIG. 12, the same effects can be achieved as the processing shown in FIG. 10. In addition, according to the processing shown in FIG. 12, even if there is temporarily a positive determination in step 1200 such that the E/G stop vehicle speed Vth is set to the predetermined value V1, before the deceleration S&S or the stop S&S is initiated thereafter, it is possible to recover the E/G stop vehicle speed Vth to the normal value V0 according to the determination result in step 1203. That is, even in the case where the open circuit fault of the battery 60 is temporarily detected in step 1200 such that the E/G stop vehicle speed Vth is set to the predetermined value V1, thereafter whether or not the open circuit fault occurs in the battery 60 will be confirmed again. Thus, even in the case where the open circuit fault of the battery 60 is misdetected in step 1200, it is possible to recover the E/G stop vehicle speed Vth to the normal value V0 by the redetermination thereafter. As a result, it is possible to reduce the situation where the opportunity for improving fuel economy is lost due to misdetection of the open circuit fault of the battery 60.

In addition, in the processing shown in FIG. 12, in the case where the open circuit fault of the battery 60 is temporarily detected in step 1200 such that the E/G stop vehicle speed Vth is set to the predetermined value V1, the determination in step 1203 is repeatedly performed at a predetermined processing cycle time, until the engine 42 is stopped by the deceleration S&S or the stop S&S. However, the determination in step 1203 may be performed, before the engine 42 is stopped by the deceleration S&S or the stop S&S, only once, or may be performed predetermined times no less than twice. In addition, the determination in step 1203 may be performed, before the engine 42 is stopped by the deceleration S&S or the stop S&S, every predetermined period of time (>>the predetermined processing cycle time) has elapsed, and may also be performed upon every predetermined travel distance.

Figure 13:
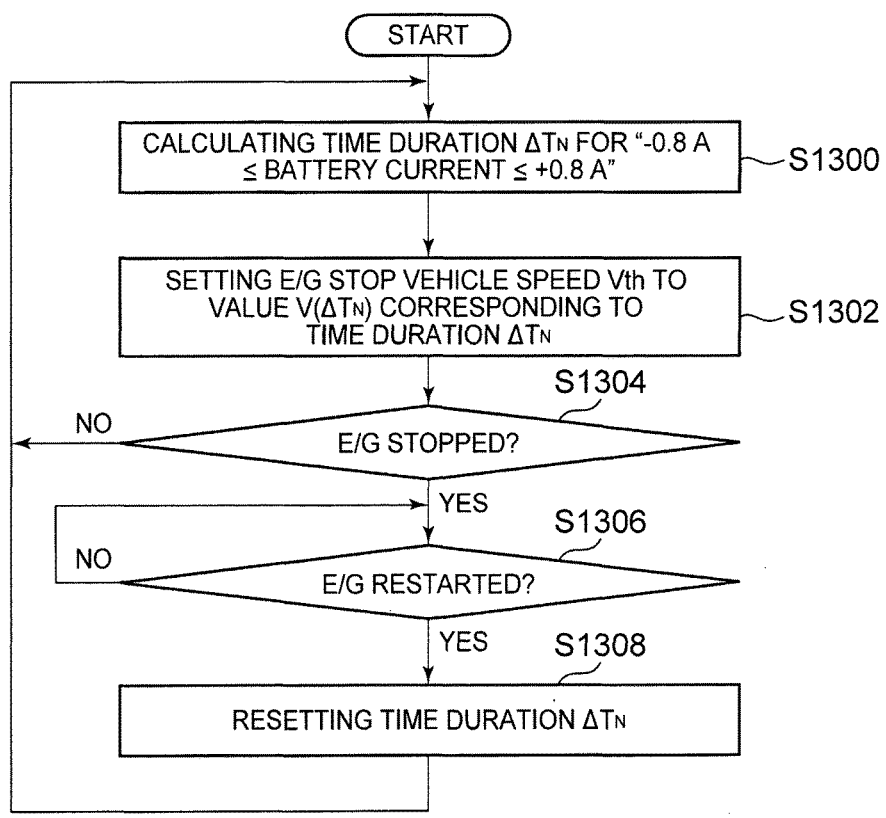
FIG. 13 is a flowchart showing another example of processing performed by the abnormality detection part and the control suppression part.

FIG. 13 is a flowchart showing another example of processing performed by the abnormality detection part 20 and the control suppression part 22. The processing routine shown in FIG. 13 is initiated, for example, upon turning-on of the ignition switch of the vehicle, and then is repeatedly performed at a predetermined processing cycle time, until the ignition switch is turned off. However, the processing in step 1300 and step 1302 is only performed during travel of the vehicle.

As with the processing shown in FIG. 10, in the processing shown in FIG. 13, as a premise, it is configured such that the deceleration S&S is performed in a deceleration state with a speed at or below the E/G stop vehicle speed Vth. In other words, the deceleration S&S initiation conditions include the deceleration state with a speed at or below the E/G stop vehicle speed Vth. In addition, in the example shown in FIG. 13, since the deceleration S&S prohibition flag is not used, the deceleration S&S prohibition flag may be omitted. Therefore, the processing shown in FIG. 13 is suitable for the situation where the S&S control part 30 performs the processing shown in FIG. 5.

In step 1300, the abnormality detection part 20 calculates the time duration ΔTN during which the current of the battery continues to be within the predetermined range ΔA1 based on the detected value of the current sensor 62. The initial value of the time duration ΔTN is 0. The time duration ΔTN may be calculated by a counter. For example, it may be configured such that within a certain processing cycle time, in the case where the current of the battery is within the predetermined range ΔA1, a count value is incremented by 1, and in the case where the current of the battery is not within the predetermined range ΔA1, the count value is decremented by 1. In this case, the count valuexthe processing cycle time corresponds to the time duration ΔTN. The time duration ΔTN is an index representative of the possibility of open circuit fault of the battery 60, and the longer the time duration ΔTN is, the higher the possibility that an open circuit fault occurs in the battery 60 is.

In step 1302, the control suppression part 22 sets the E/G stop vehicle speed Vth to a value V(ΔTN) corresponding to the time duration ΔTN calculated in the above step 1300. The value V(ΔTN) is set in such a manner that the longer the time duration ΔTN is, the smaller the value V(ΔTN) is. For example, the value V(ΔTN) can be set to be variable based on the concept shown in FIG. 11. Specifically, the E/G restart failure probability P1 is converted according to the time duration ΔTN (e.g. the E/G restart failure probability P1 is in proportion with the time duration ΔTN) and derived, and the value V(ΔTN) is set corresponding to the time duration ΔTN so that the E/G restart failure probability P1 falls within the region "OK".

Alternatively, simply, the value V(ΔTN) when the time duration ΔTN is 0 may be the normal value V0 (refer to FIG. 10). In addition, the value V(ΔTN) when the time duration ΔTN becomes the predetermined time ΔT1 may be the predetermined value V1. In this case, the value V(ΔTN) may be decreased linearly or non-linearly from the normal value V0 to the predetermined value V1 with the increase of the time duration ΔTN. At this time, in the case where the time duration ΔTN exceeds the predetermined time ΔT1, the value V(ΔTN) may either be maintained at the predetermined value V1, or decreased towards 0 with the increase of the time duration ΔTN.

In step 1304, the control suppression part 22 determines whether or not the engine 42 has been stopped by the deceleration S&S or the stop S&S. Whether or not the engine 42 has been stopped by the deceleration S&S or the stop S&S can be determined on the basis of the information obtained from the S&S control part 30. In the case where it is determined that the engine 42 has been stopped by the deceleration S&S or the stop S&S, the processing proceeds to step 1306, otherwise returns to step 1300.

In step 1306, the control suppression part 22 determines whether or not the engine 42 has been restarted following termination of the deceleration S&S or the stop S&S. Whether or not the engine 42 has been restarted can be determined on the basis of the information obtained from the S&S control part 30. In the case where it is determined that the engine 42 has been restarted, the processing proceeds to step 1308, otherwise it becomes a state to wait for restart of the engine.

In step 1308, the abnormality detection part 20 resets the time duration ΔTN to the initial value 0.

According to the processing shown in FIG. 13, the E/G stop vehicle speed Vth as the deceleration S&S initiation condition is set to a value V(ΔTN) corresponding to the time duration ΔTN. As described above, the time duration ΔTN is the duration during which the current of the battery continues to be within the predetermined range ΔA1, and is an index representative of the possibility of open circuit fault of the battery 60. In addition, as described above, the value V(ΔTN) is set in such a manner that the longer the time duration ΔTN is, the smaller it is. Therefore, the value V(ΔTN) is set in such a manner that the higher the possibility of open circuit fault of the battery 60 is, the smaller it is. Thus, with the possibility of open circuit fault of the battery 60 being higher, it is possible to decrease the E/G stop vehicle speed Vth as the deceleration S&S initiation condition to a greater extent.

In addition, in the processing shown in FIG. 13, the time duration ΔTN may also be reset in the case where a predetermined condition other than restart of the engine 42 is satisfied. For example, based on the concept shown in FIG. 10, the time duration ΔTN may be reset if the state where the current of the battery is within the predetermined range ΔA2 has continued for the predetermined time ΔT2.

While various embodiments have been described in detail, the present invention is not limited to the specific embodiments, and various variations and modifications can be made within the scope as defined in the following claims. In addition, it is also possible to combine all or part of the constitutional elements in the previous embodiments.

For example, in the above embodiments, the deceleration S&S is performed on condition of the deceleration state, however, it may also be performed in states other than the deceleration state. That is, the deceleration S&S may be substituted by the S&S performed in vehicle non-stop state (non-stop S&S). The vehicle non-stop state may be a deceleration state and/or a stable travel state (or neutral gear travel state). In addition, the vehicle non-stop state may also be a travel state with a vehicle speed at or below the E/G stop vehicle speed Vth. The travel state with a vehicle speed at or below the E/G stop vehicle speed Vth may be a deceleration state at or below the E/G stop vehicle speed Vth and/or a stable travel state at or below the E/G stop vehicle speed (or neutral gear travel state). In addition, the deceleration state may either be a deceleration state having a predetermined deceleration or below, or a state in which merely the brake pedal is operated.

What is claimed is:

1. A vehicle control apparatus, comprising:
a current sensor that detects a current value of a battery; and
a processing device that suppresses initiation of idling stop control in a vehicle non-stop state with a vehicle speed higher than 0, in the case where an abnormal state of the battery is detected based on an output signal of the current sensor in the vehicle non-stop state, wherein
the processing device initiates the idling stop control in the case where predetermined initiation conditions, including the vehicle speed being at or lower than a predetermined vehicle speed, are satisfied, and the processing device sets the predetermined vehicle speed as a first value in the case where the abnormal state of the battery is not detected, and sets the predetermined vehicle speed as a second value smaller than the first value in the case where the abnormal state of the battery is detected, and
the processing device, during stop of the engine by the idling stop control, restarts the engine in the case where predetermined termination conditions are satisfied, and the processing device sets the predetermined vehicle speed, which has been set as the second value when the abnormal state of the battery is detected, as the first value following the restart of the engine.

2. The vehicle control apparatus according to claim 1, wherein
the processing device is configured to enable the initiation of the idling stop control in the vehicle stop state in the case where the abnormal state of the battery is detected.

3. The vehicle control apparatus according to claim 1, wherein
the processing device detects the abnormal state of the battery only based on the output signal of the current sensor.

4. The vehicle control apparatus according to claim 1, wherein
the processing device detects the case where it is detected based on the output signal of the current sensor that a state in which the current value of the battery is within a predetermined range has continued for a predetermined time, as the abnormal state of the battery.

5. The vehicle control apparatus according to claim 1, wherein
the processing device, after the abnormal state of the battery is detected, determines whether or not a state in which the current value of the battery is out of a predetermined range has continued for a predetermined time, based on the output signal of the current sensor in the vehicle non-stop state,
the processing device, in the case where it is determined that the state in which the current value of the battery is out of the predetermined range has continued for the predetermined time, sets the predetermined vehicle speed, which has been set as the second value when the abnormal state of the battery is detected, as the first value.

6. The vehicle control apparatus according to claim 1, wherein
the processing device, in the vehicle non-stop state, calculates the time duration during which a state in which the current value of the battery continues to be within a predetermined range, based on the output signal of the current sensor, and the processing device changes the predetermined vehicle speed from the first value to the second value by stages in such a manner that the longer the time duration is, the lower the predetermined vehicle speed is.

7. The vehicle control apparatus according to claim 1, wherein
the second value is 0.

8. A vehicle control apparatus, comprising:
a current sensor that detects a current value of a battery; and
a processing device that suppresses initiation of idling stop control in a vehicle non-stop state with a vehicle speed higher than 0, in the case where an abnormal state of the battery is detected based on an output signal of the current sensor in the vehicle non-stop state, wherein
the processing device initiates the idling stop control in the case where predetermined initiation conditions, including the vehicle speed being at or lower than a predetermined vehicle speed, are satisfied, and the processing device sets the predetermined vehicle speed as a first value in the case where the abnormal state of the battery is not detected, and sets the predetermined vehicle speed as a second value smaller than the first value in the case where the abnormal state of the battery is detected,
the processing device, after the abnormal state of the battery is detected, determines whether or not a state in which the current value of the battery is out of a predetermined range has continued for a predetermined time, based on the output signal of the current sensor in the vehicle non-stop state, and
the processing device, in the case where it is determined that the state in which the current value of the battery is out of the predetermined range has continued for the predetermined time, sets the predetermined vehicle speed, which has been set as the second value when the abnormal state of the battery is detected, as the first value.

9. A vehicle control apparatus, comprising:
a current sensor that detects a current value of a battery; and
a processing device that suppresses initiation of idling stop control in a vehicle non-stop state with a vehicle speed higher than 0, in the case where an abnormal state of the battery is detected based on an output signal of the current sensor in the vehicle non-stop state, wherein
the processing device initiates the idling stop control in the case where predetermined initiation conditions, including the vehicle speed being at or lower than a predetermined vehicle speed, are satisfied, and the processing device sets the predetermined vehicle speed as a first value in the case where the abnormal state of the battery is not detected, and sets the predetermined vehicle speed as a second value smaller than the first value in the case where the abnormal state of the battery is detected, and
the processing device, in the vehicle non-stop state, calculates the time duration during which a state in which the current value of the battery continues to be within a predetermined range, based on the output signal of the current sensor, and the processing device changes the predetermined vehicle speed from the first value to the second value by stages in such a manner that the longer the time duration is, the lower the predetermined vehicle speed is.

* * * * *